United States Patent [19]

Stephens, Jr. et al.

[11] Patent Number: 5,295,101
[45] Date of Patent: Mar. 15, 1994

[54] ARRAY BLOCK LEVEL REDUNDANCY WITH STEERING LOGIC

[75] Inventors: Michael C. Stephens, Jr.; Scott E. Smith; Charles J. Pilch, all of Sugar Land; Duy-Loan T. Le, Missouri City; Terry T. Tsai, Houston; Arthur R. Piejko, Sugar Land, all of Tex.

[73] Assignee: Texas Instruments Incorporated, Dallas, Tex.

[21] Appl. No.: 829,124

[22] Filed: Jan. 31, 1992

[51] Int. Cl.$^5$ .............................................. G11C 7/00
[52] U.S. Cl. ............................... 365/200; 365/230.03; 371/10.2
[58] Field of Search ............................ 365/200, 230.03; 371/10.2

[56] References Cited

U.S. PATENT DOCUMENTS

| | | | |
|---|---|---|---|
| 5,033,024 | 7/1991 | O'Connell et al. | 365/200 X |
| 5,060,197 | 10/1991 | Park et al. | 365/200 |
| 5,126,973 | 6/1992 | Gallia et al. | 365/200 |

Primary Examiner—Joseph A. Popek
Assistant Examiner—Do Hyum Yoo
Attorney, Agent, or Firm—Ronald O. Neerings; Richard B. Havill; Richard L. Donaldson

[57] ABSTRACT

The described embodiments of the present invention provide a circuit and method for a two level redundancy scheme for a semiconductor memory device. The memory device has one or more data blocks (12) with each data block (12) having an array of memory cells arranged in addressable rows and columns along row lines and column lines. Each array is configured into sub-blocks (14) with each sub-block having a plurality of the memory cells. The first level redundancy scheme includes a few redundant elements for each sub-block for the replacement of defective elements, as is common in many modern semiconductor devices. The second level redundancy scheme includes at least one redundant sub-block of memory cells as part of the main memory for a fully functional memory device or, as an extra level of redundancy for at least one sub-block of memory cells containing defects which are not repairable using the redundant elements. When activated for redundancy, the second level redundancy scheme replaces at least one defective sub-block of memory devices with a like number of redundant sub-blocks of memory devices.

17 Claims, 7 Drawing Sheets

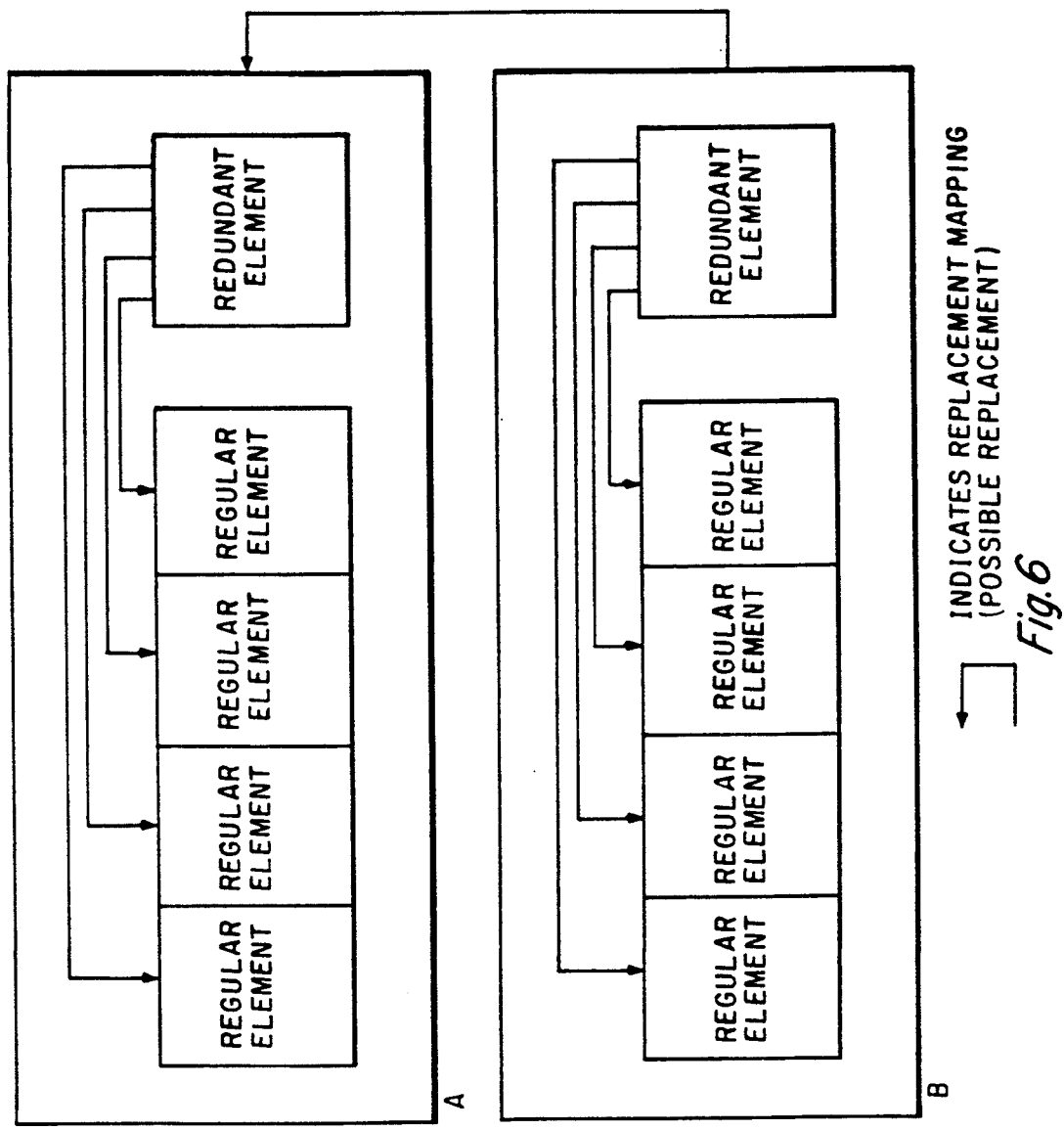

ARRAY BLOCK LEVEL REDUNDANCY WITH STEERING LOGIC

FIELD OF THE INVENTION

The present invention relates to the field of semiconductor memory devices and, more particularly, to devices which include repair circuitry for eliminating defects in memory devices.

BACKGROUND OF THE INVENTION

In the fabrication of semiconductor memory devices it is common for an array of memory cells to include one or more defects which prevent the proper performance of the memory circuit. If a type of defect occurs systematically it can often be causally analyzed and designed out. Other defects which are generally not systematic include short circuits between adjacent columns and open circuits within individual columns of memory cells. For analysis purposes the distribution of such defects in a memory device, as well as the distribution of the number of defects among a given production lot, may be considered random so that the yield of good devices in a lot can be modelled according to a Poisson distribution function. Typically, over the period of time that a particular device or family of devices is being produced in a given manufacturing facility the product yield can be improved by removing causes, e.g., particulate matter, of the above-mentioned random defects.

Unfortunately, the causes of random defects cannot be completely eliminated in many fabrication processes. Redundancy schemes have been introduced to reduce the effect these defects have on device yield. The redundancy schemes normally consist of a few extra rows and columns of memory cells that are placed within the memory array to replace defective rows and columns of memory cells. In theory, these extra rows and columns of memory cells should maximize the yield of a production lot. Practically, however, many potentially functional devices must be rejected because the number of available redundant elements on the chip prove to be insufficient to meet the repair needs of the device.

One possible solution to the problem of defects is simply to increase the number of available redundant elements. Area constraints of dense modern memory devices, however, determine an upper limit to these types of additions. What is needed is a novel approach of incorporating an additional level of redundancy that can be used to obtain a functional product once the standard redundancy system has been exhausted.

SUMMARY OF THE INVENTION

The described embodiments of the present invention provide a circuit and method for employing a second level of redundancy that allows the use of memory allocated for parity bit storage in a DRAM part to be used as redundancy to yield a functional DRAM. The second level of redundancy can be used once the first level of redundancy, having standard redundant elements, is exhausted. The embodiments described provide this function for dynamic random access memories (DRAMs) but are applicable to other integrated circuits.

In a preferred embodiment, a second level of redundancy is used to yield a functional 16 Mb DRAM part from an intended 18 Mb DRAM part containing up to 2 Mb of defective, irreparable memory locations. Without this system, many salvageable 18 Mb DRAM parts would have to be rejected due to standard redundant element exhaustion. Also, it is important to note that part rejection due to an insufficient number of standard redundant elements is more common with fabrication processes that are not yet mature. It follows that the device yield can be greatly improved with this scheme at the early stages of process development.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 6 illustrates in block diagram form a second level redundancy scheme according to the invention.

DETAILED DESCRIPTION OF THE INVENTION

Figure 1:
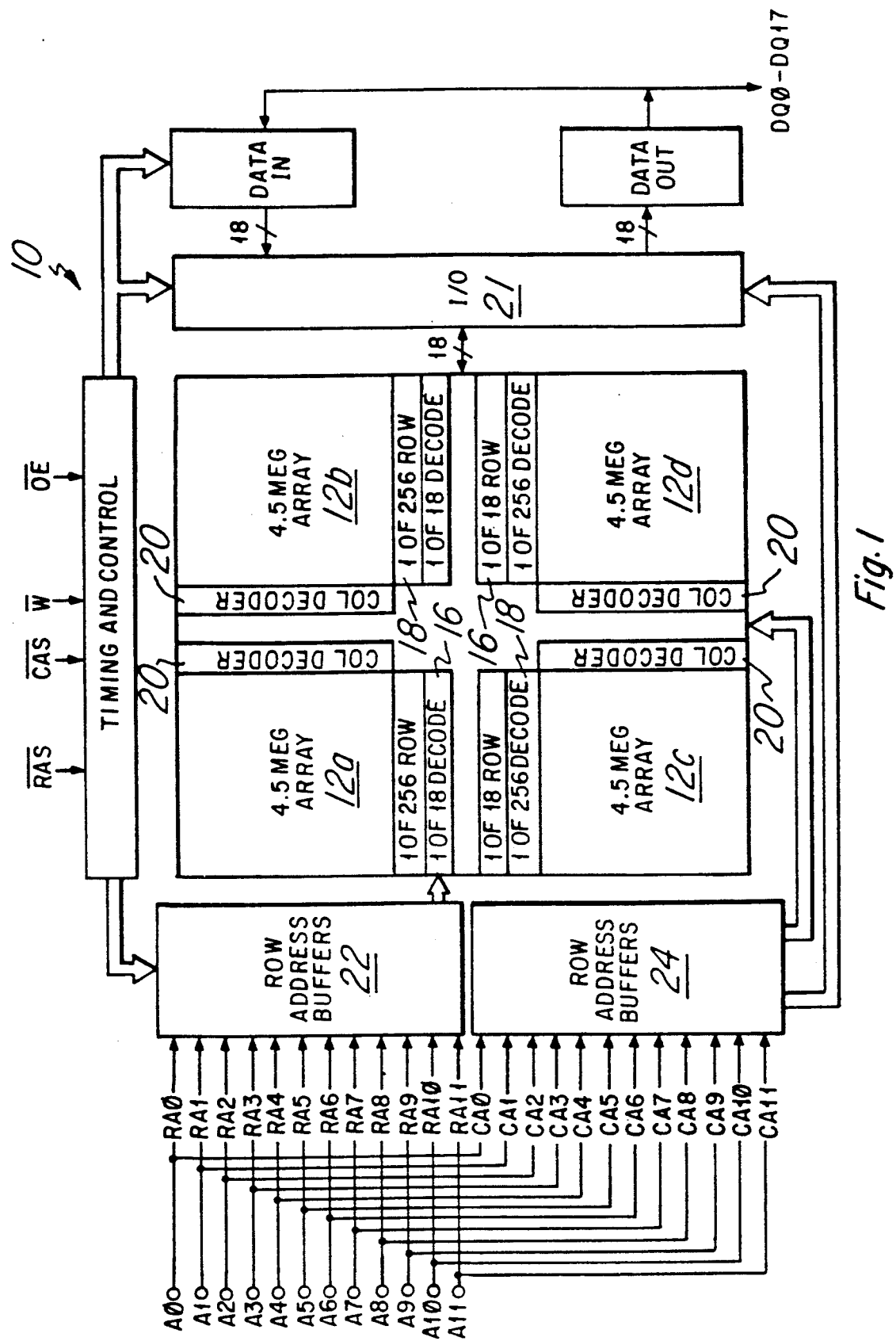
FIG. 1 is a plan view of a memory device which may incorporate the invention.

The block diagram of FIG. 1 illustrates a semiconductor memory device with which the invention may be practiced. This exemplary device 10 is a DRAM of the so-called 16 Megabit (Mb) density, but virtually contains 18 megabits of storage capability, including 2 megabits dedicated to parity bit storage. Device 10 has $(2^{18}) \times 72$ or 18,874,368 one-transistor storage cells arranged in rows and columns. According to a preferred architecture, the device is partitioned into four identical logical data blocks 12, individually designated 12a, 12b, 12c and 12d. Each block 12 is of the four and one half (4.5) megabit size, comprising 4,718,592 memory cells arranged in an array of 4,608 rows R and 1,024 columns C.

Figure 2:
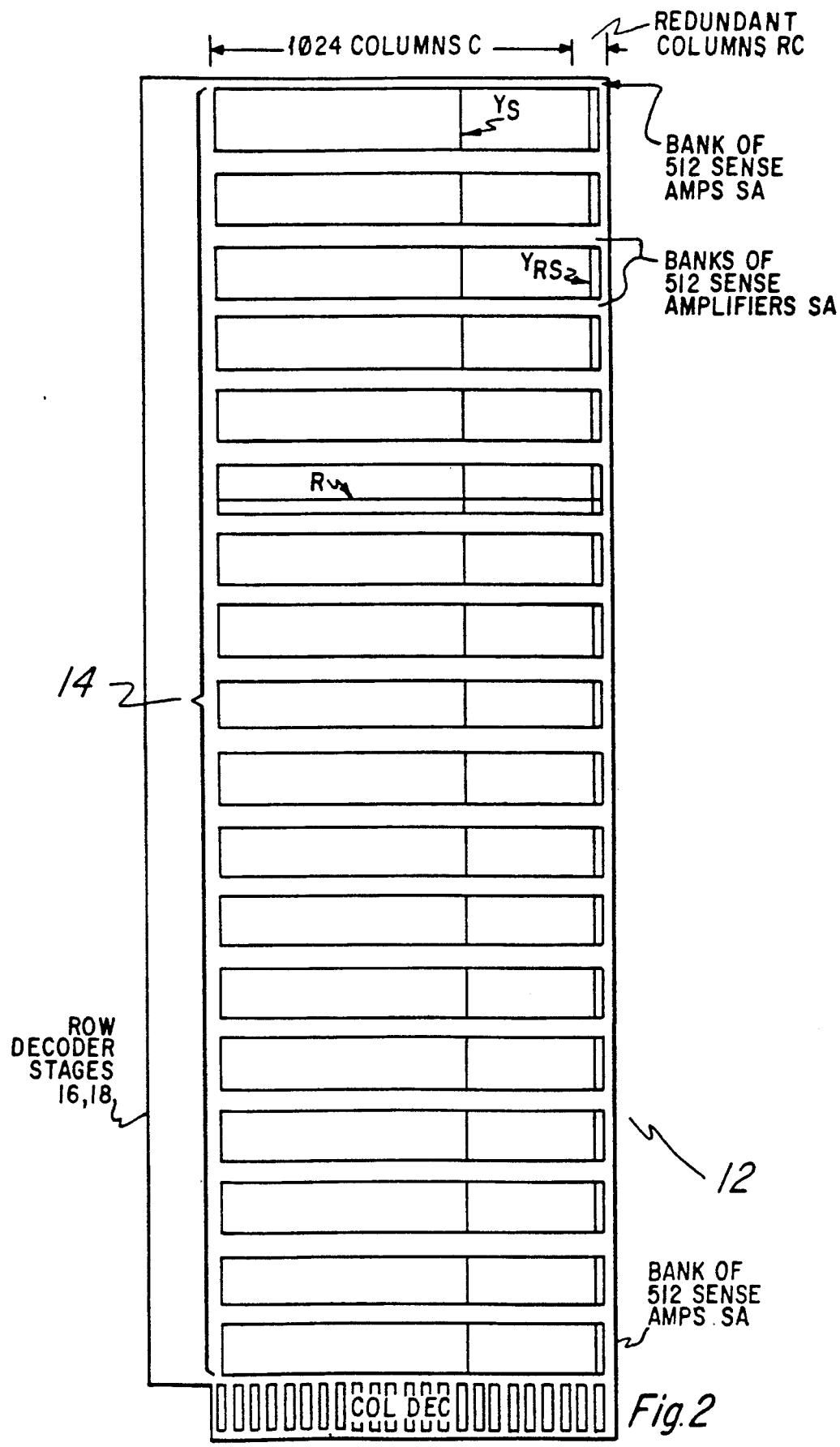
FIG. 2 illustrates the general layout of a logical data block in the device of FIG. 1.

As shown in FIG. 2, each data block 12 is partitioned into eighteen sub-blocks 14. Within each sub-block 14 there are 256 row or word lines R and 256 column select lines $Y_s$. A row line is selectable based on row address information input to a one of 18 row decoder stage 16 and a one of 256 row decoder stage 18. In each data block 12 column address decoders 20 turn on a select line $Y_s$ to control read/write data transfer for four columns each having 256 physical rows.

Figure 3:
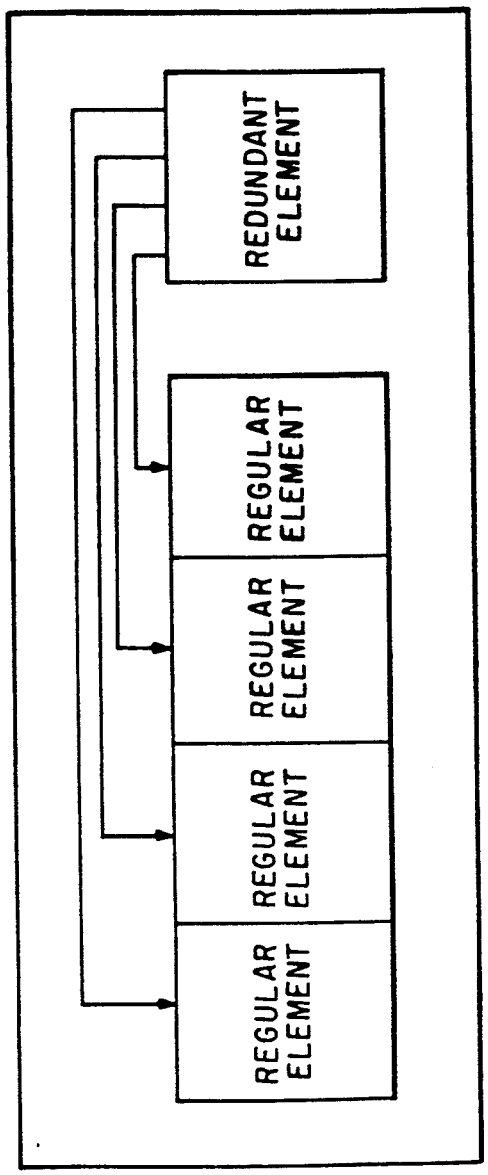
FIG. 3 illustrates in block diagram form a standard first level redundancy scheme.
Figure 4:
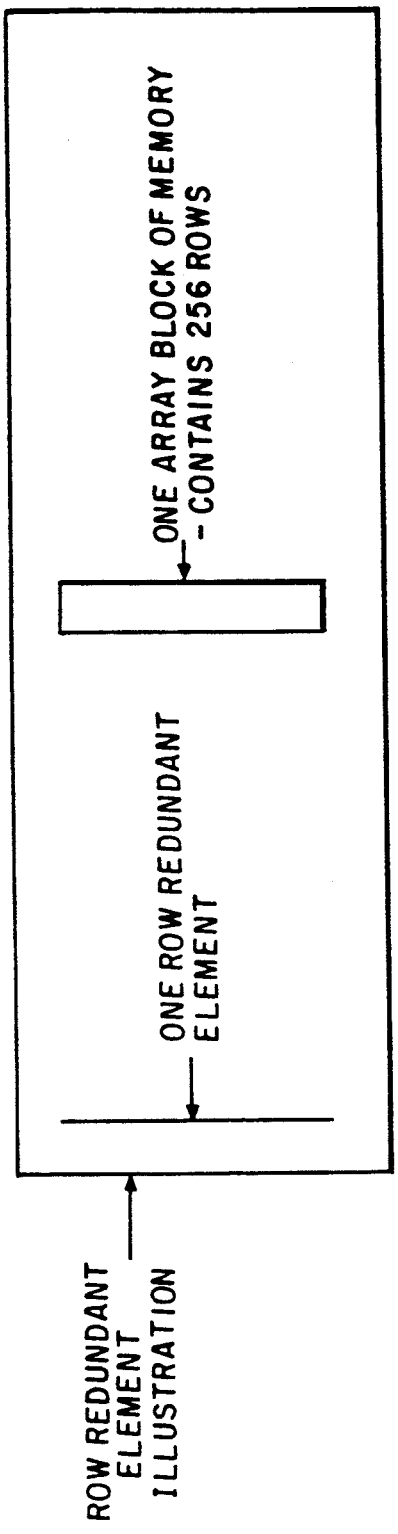
FIG. 4 illustrates in block diagram form one redundant row line for an array block of memory.
Figure 5:
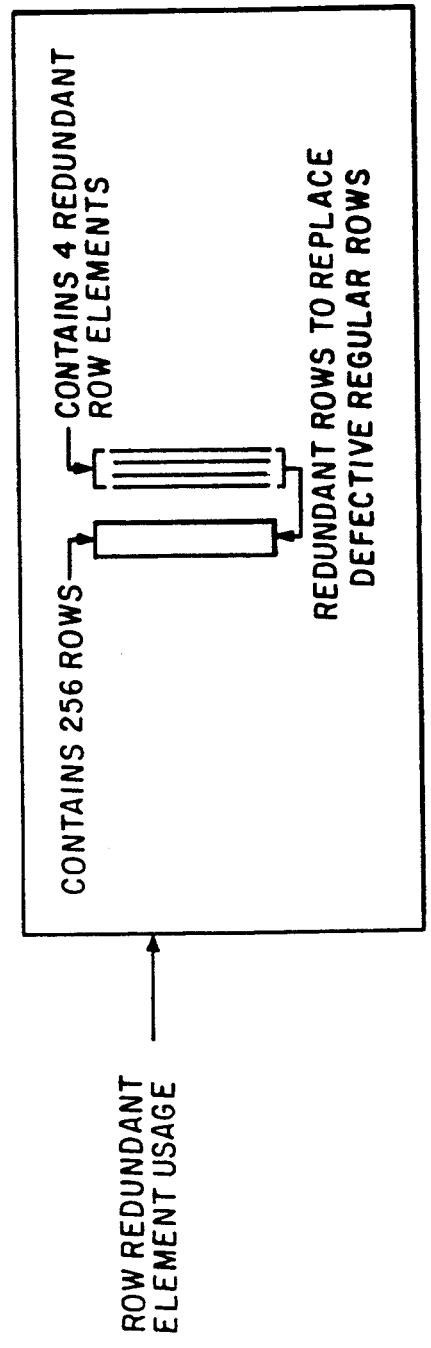
FIG. 5 illustrates in block diagram form a standard first level row redundancy scheme.

Device 10 includes a first level redundancy system for overcoming defects in the logical data blocks 12. In its most basic form, the first level redundancy system, shown in FIG. 3, provides a redundant element which may replace in function any one of the regular elements. This first level redundancy system lends itself to replacement of a defective column or row with any of multiple identical redundant columns or rows. Such a redundancy system is common on many modern DRAM circuits. For example, one row redundant element may be used to replace one defective row in an array block, as shown in FIG. 4. More typically, each sub-block 14 includes multiple redundant row lines, usually four, in addition to the regular 256 rows as shown in FIG. 5. All four redundancy rows in FIG. 5 are located on the right side of the 256K block. Each of these redundant wordlines is capable of replacing any of the faulty rows within the same block.

Figure 7:
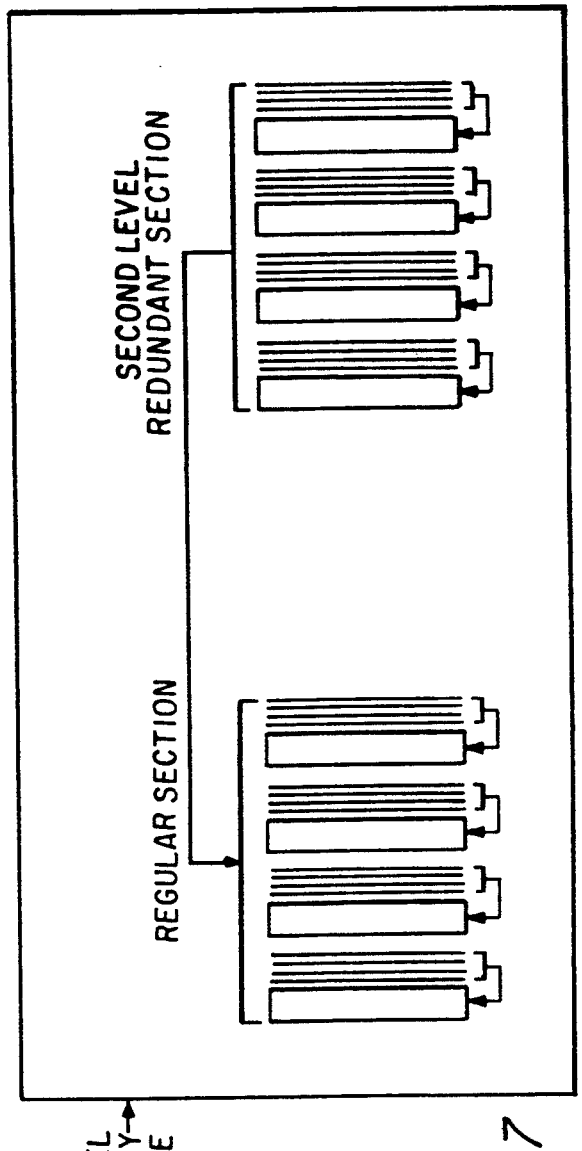
FIG. 7 illustrates in block diagram form the second level redundancy system as it relates to the standard first level row redundancy scheme.

In a preferred embodiment of the invention, a second level redundancy system is added to the first level redundancy system of device 10 that can be used once the first level redundancy system has been exhausted. FIG. 6 shows the basic concept of this second level redundancy system in which an entire block A of memory elements are replaced by memory block B. FIG. 7 shows the second level redundancy system as it relates to the first level redundancy system. Four array blocks and their associated redundant rows form the second level redundancy replacement unit or section. The choice of four adjacent array blocks to form the replacement memory section here results from row path decoding access patterns inherent in the preferred embodiment. This allows simplification of the section replacement logic. It is, however, largely an arbitrary choice and it does not indicate a restriction on the second level redundancy system.

Figure 8:
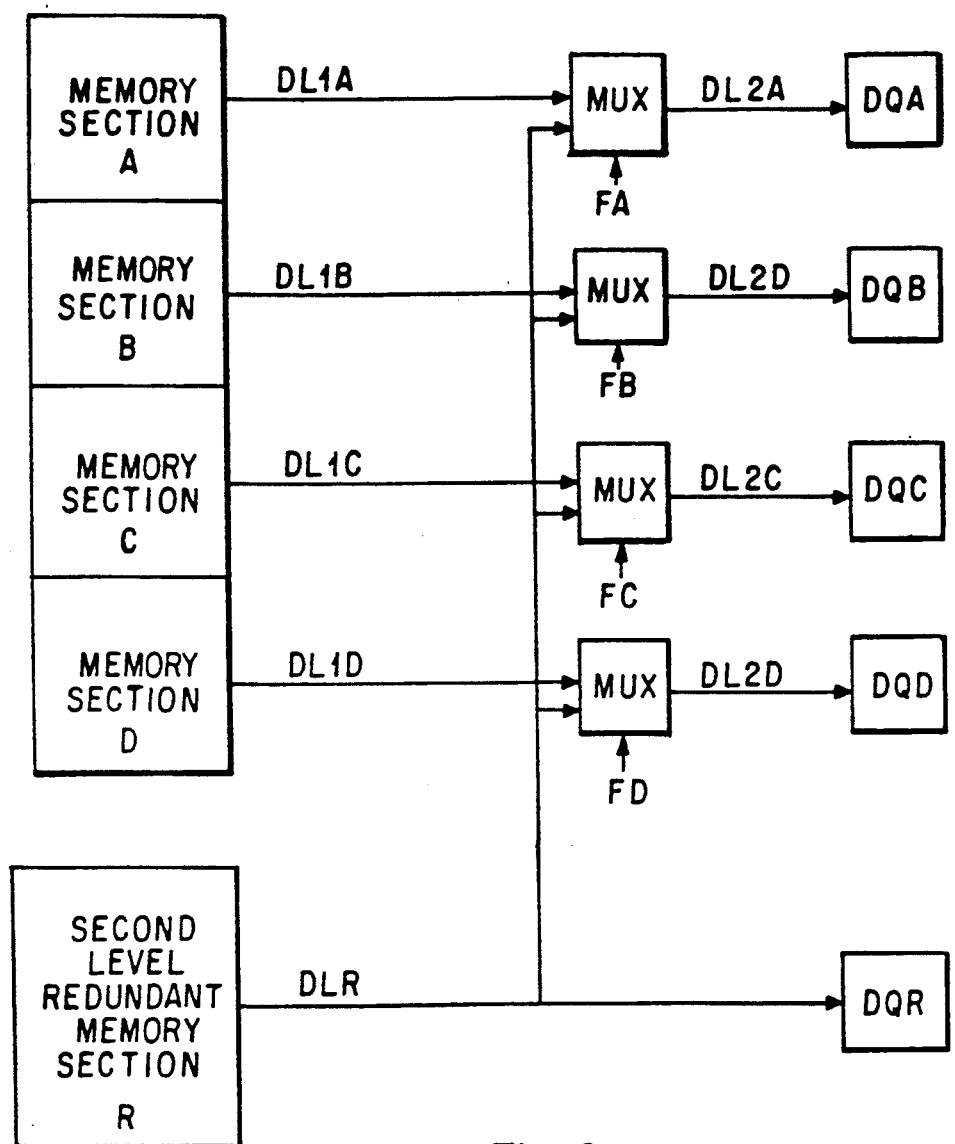
FIG. 8 illustrates in block diagram form the steering system according to the invention.

FIG. 8 shows the associated steering system that redirects the replacement section I/O to the appropriate DQ (input/output) pin. The REGULAR SECTION shown in FIG. 7 is an example of one of MEMORY SECTION A-D of FIG. 8. The steering system in this preferred embodiment uses signals FA, FB, FC and FD as defective section indicator signals. One method of generating these signals is via fuse logic implementation (not shown). That is, if a section is defective, a corresponding fuse structure is blown via laser and a logic high level ("1") is the resulting boolean equivalent of the logic circuit implementation. Similarly, if a section is fully functional, then its corresponding fuse structure is left intact and the resulting boolean equivalent is a logic low level ("0").

If the steering system is enabled, one of FA-FD will go active high and DLR will be directed to the corresponding DL2A-DL2D line.

For example, if FB=1 (logic high level) and FA=FC=FD=0 (logic low level), then DL1B will be multiplexed out and DLR will effectively replace this line at DL2B. It should be noted that the output at DQR is now redundant and it can be discarded or suppressed. The resulting part contains four fully functional memory sections whereas an original fully functional version contains five effective memory sections. That is, block R acts as part of the main memory for a fully functional part; however, it acts as an extra level of redundancy for a part containing a defective and irreparable memory section.

The specific product that has provided motivation for the above-mentioned scheme is the 1M×18/2M×9 DRAM. This set of devices stores parity bits associated with the 8-bit words. Also, the array block organization of this device allows for 2 Mb of its 18 Mb of memory to replace in function 2 Mb of defective memory. The resulting device contains 16 Mb of functional memory and is then organized as 1M×16/2M×8. This device stores no parity bits. In fact, the portion of the 1M×18/2M×9 that is used to functionally replace the defective memory portion(s) is the part of memory allocated for parity bit storage in the fully functional 1M×18/2M×9 part.

Figure 9:
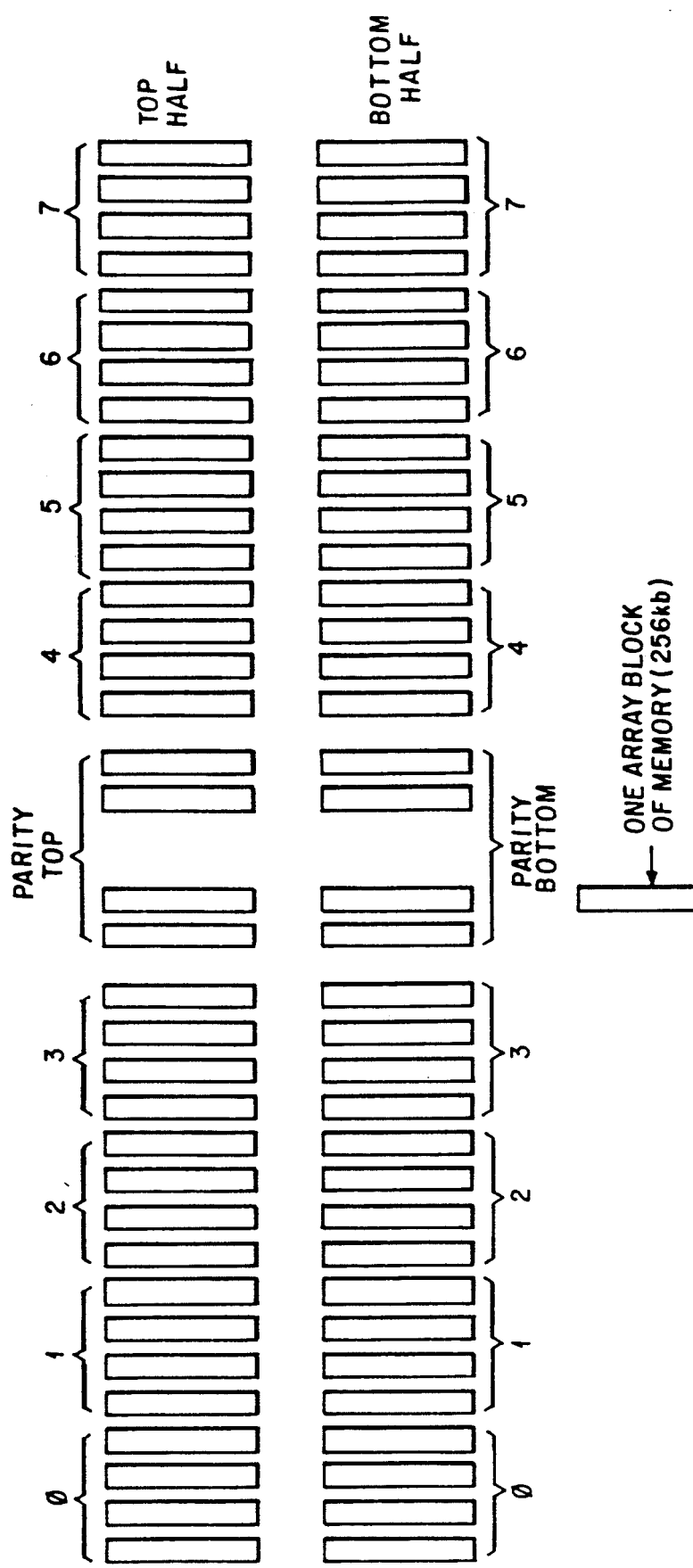
FIG. 9 illustrates in block diagram form the conceptual partitioning of the total chip memory into sections of memory.

FIG. 9 illustrates the conceptual partitioning of the total chip memory into sections of memory. Each section contains four memory array blocks or 1 Mb of memory and is indicated by brackets. The parity sections are labelled on the diagram as parity top and parity bottom. These two sections serve as replacement sections. These parity sections provide the second level of redundancy as each is able to wholly replace in function any one of the other sections labelled 0–7.

Each section has a fuse circuit associated with it (not shown) where a blown fuse indicates that the section is defective. A section is considered defective if any array block within that section contains a defect that cannot be repaired using the existing first (standard) level redundant elements. As part of this preferred embodiment implementation, a defective section is made to resemble a fully functional section in its precharge cycle. That is, the sensing activation circuits accessing the defective section operate to maintain bitline equalization and to suppress wordline rise. Thus, power is not wasted on a memory section that will be effectively replaced.

The other main functional part needed to implement this preferred embodiment is the steering logic, previously discussed and shown in FIG. 8. This is the logic circuit that acts to multiplex between data from the defective section and data from the replacing section. This operation is done at the I/O level and it involves using the defective section indicator fuses to steer the data from the replacing section to the appropriate DQ(s) previously associated with the defective section(s).

In summary, this preferred embodiment allows the use of 2 Mb of memory allocated for parity bit storage in an 18 Mb DRAM part to be used as redundancy in yielding a 16 Mb DRAM. Without this system, many salvageable 18 Mb DRAM parts would have to be rejected due to standard redundant element exhaustion. Also, it is important to note that part rejection due to an insufficient number of standard redundant elements is more common with fabrication processes that are not yet mature. It follows that the device yield can be greatly improved with this scheme at the early stages of process development.

While this invention has been described with reference to an illustrative embodiment, this description is not intended to be construed in a limiting sense. Various modifications to the illustrative embodiment, as well as other embodiments of the invention will be apparent to persons skilled in the art upon reference to this description. It is therefore contemplated that the appended claims will cover any such modifications or embodiments as fall within the true scope of the invention.

What is claimed:

1. A memory device with one or more data blocks each having individual input-output paths, at least one data block comprising:
   an array of memory cells arranged along row lines and column lines and configured in sub-blocks each comprising a plurality of memory cells arranged in rows and columns; and
   support circuitry to read information from the memory cells and to write information into the memory cells, the support circuitry including redundancy circuitry for replacing at least one defective sub-block of memory cells with a like number of functional sub-blocks of memory cells, each sub-block of memory cells including redundant elements for replacing defective elements.

2. The memory device of claim 1 in which said redundant elements are redundant rows of memory cells for replacement of defective rows of memory cells.

3. The memory device of claim 2 in which there are four redundant rows per sub-block.

4. The memory device of claim 1 in which said redundancy circuitry selects four functional sub-blocks of memory cells for replacement of four sub-blocks of defective memory cells.

5. The memory device of claim 4 in which said four functional sub-blocks of memory cells are adjacent to each other.

6. The memory device of claim 1 in which said redundancy circuitry includes steering logic to redirect a replacement block I/O to an appropriate DQ (input/output) pin.

7. The memory device of claim 6 in which said steering logic includes defective section indicator signals for indicating that a deffective section has at least one sub-block with a defect that cannot be repaired using said sub-block's redundant elements.

8. The memory device of claim 7 including a multiplexer having a first input connected to a memory section, a second input connected to a redundant memory section, a third input for receiving a defective section indicator signal indicating that said memory section has a defect that cannot be repaired using said memory section's redundant elements and an output connected to a DQ pin.

9. The memory device of claim 8 in which said multiplexer couples said memory section to said DQ pin when said defective section indicator signal indicates no-defects and, in the alternative, couples said redundant memory section to said DQ pin when said defective section indicator signal indicates a defect in said memory section that cannot be repaired using said memory section's redundant elements.

10. A memory device with one or more data blocks each having individual input/output paths, one data block comprising:
an array of memory cells arranged along row lines and column lines and configured in sub-blocks each comprising a plurality of memory cells arranged in rows and columns and also having redundant rows of memory cells to substitute for defective rows;
support circuitry to read information from the memory cells and to write information into the memory cells, the support circuitry including:
row redundant circuitry for replacing a defective row of memory cells with a redundant row of memory cells in only the sub-block having the defective row of memory cells; and
block level redundant circuitry for replacing at least one defective sub-block of memory cells with a like number of functional sub-block of memory cells.

11. A method of repairing defects in a memory device, comprising the steps of:
providing a first level of redundancy for at least one block of memory cells in said memory device, said at least one block of memory cells is divided into sub-blocks of memory cells and said first level of redundancy provides redundant elements for at least one of said sub-blocks of memory cells; and
providing a second level of redundancy for said at least one block of memory cells that can be utilized once said first level of redundancy has been exhausted.

12. The method of claim 11 in which said defects are defective memory cells.

13. The method of claim 12 in which said defective memory cells are defective row memory cells.

14. The method of claim 11 in which said second level of redundancy is a second block of memory cells that replaces said at least one block of memory cells having at least one defect that cannot be repaired using said first level of redundancy.

15. The method of claim 11 including defective section indicator signals for indicating that a defective section has at least one sub-block with a defect that cannot be repaired using said sub-block's redundant elements.

16. The method of claim 15 including steering logic for multiplexing between data from a defective section indicating that it has at least one sub-block with a defect that cannot be repaired and data from a replacing section.

17. The method of claim 16 in which said steering logic couples said block of memory cells to a selected DQ pin when said defective section indicator signal indicates no-defects and, in the alternative, couples said selected DQ pin to said replacing section when said defective section indicator signal indicates a defect in said block of memory cells that cannot be repaired using said block of memory cells' redundant elements.

* * * * *